United States Patent Office 3,287,128

Patented Nov. 22, 1966

3,287,128

LITHOGRAPHIC PLATES AND COATINGS

Myron N. Lugasch, deceased, late of Columbus, Ohio, by Phyllis T. Lugasch, widow and heir, Scranton, Pa., assignor, by mesne assignments, to Martin Marietta Corporation, New York, N.Y., a corporation of Maryland No Drawing. Filed Apr. 22, 1963, Ser. No. 274,868
22 Claims. (Cl. 96—33)

This invention relates to a novel composition useful in preparing lithographic plates, particularly deep-etched lithographic plates, a stable, presensitized lithographic plate capable of being processed to form a deep-etched lithographic plate and to a method of preparing a deep-etched, lithographic plate.

There are three major graphic arts processes in common use in the industry. There are (a) the "relief process" usually referred to as letterpress printing, (b) the "intaglio process" commonly referred to as gravure printing and (c) the "planographic process" usually referred to as lithographic printing. All three forms of printing make use of specially prepared printing plates. Letterpress and gravure printing use plates in which the image to be reproduced is in a different plane from that of the remainder of the plate. In the case of letterpress printing, the image to be reproduced is raised while in gravure printing, the printing surface is depressed. Lithographic plates are produced so that the printing surface lies essentially in the same plane as the non-printing surface.

The process of lithographic printing requires that the image areas of the lithographic plate be oleophylic and the non-image areas hydrophylic. Since lithographic inks have an oil base, ink will adhere only to the oleophylic portions of the plate. Therefore, when the plate is inked and brought into contact with the receiving surface, ink will be transferred to the surface only from the image portions of the plate.

The techniques employed in lithography are well known and depend to a large extent upon the type of copy being printed, the colors employed and other factors. An important feature of the process is the manufacture of the lithographic plate. There are two types of lithographic plates commonly used. One is the so-called "surface" plate and the other is the so-called "deep-etched" plate. The deep-etched plates are known to be superior since they are capable of longer press runs and of producing considerably finer grades of printing. This invention is concerned with the manufacture of an improved deep-etched lithographic plate greatly superior to those now in use, and to a composition useful in making such a plate.

It is an object of this invention to prepare a photosensitive coating composition having excellent stability in the absence of light and capable of being applied to a conventional lithographic plate base material. It is a further object of this invention to prepare a photosensitive lithographic plate which is capable of being stored for periods in excess of 6 months and for as long as several years in the substantial absence of light without any significant loss in the photosenstitivity of the coating thereon. It is a further object of this invention to reduce the time required for exposing the lithographic plate to light and for developing the surface. It is a further object of this invention to develop an improved lithographic plate capable of longer press runs and capable of reproducing in very fine detail the image being copied.

The coating compositions employed in this invention are aqueous solutions of a water soluble hydroxyalkyl ether of cellulose and a water-soluble salt of an aromatic diazide compound. These coating compositions are capable of being used in the formation of lithographic plates using conventional application technique and conventional developing solutions. Furthermore, lithographic plates coated with the coating compositions of this invention are capable of being stored, prior to exposure to light, under essentially dark conditions, for long periods of time without undergoing the "dark reaction" commonly experienced by plates coated with most other coating compositions.

The steps conventionally employed in the manufacture of deep-etched lithographic plates are generally as follows: (1) graining of the metal plate; (2) counter-etching of the plate; (3) surface treatments; (4) applying the photosensitive coating; (5) exposing the plate to light; (6) developing the plate; (7) deep-etching the plate, applying the lacquer and the developing ink; (8) removing the stencil; (9) applying a desensitizing etch; (10) gumming the plate; (11) washing out the developing ink and treating with asphaltum. In the case of preparing "presensitized" plates, i.e. plates to be stored for future exposure to light, steps 1 to 4 are carried out and the plate is then stored, ready for exposure to light. Frequently, pregrained plates can be purchased, thereby obviating the necessity for any further graining.

The coating compositions of this invention comprise a combination of a water-soluble hydroxyalkyl ether of cellulose and a water-soluble salt of an aromatic diazide compound.

Hydroxyethyl cellulose has been suggested for use in lithographic coating compositions in conjunction with potassium dichromate as the hardening agent. It has been found that such cellulose-dichromate coating compositions are disadvantageous in that the composition is very unstable and accordingly, if stored for even short periods of time, for example, for several hours, the two components, hydroxyethyl cellulose and potassium dichromate, will have reacted sufficiently to prevent further use of the composition. In addition, even when such a plate is used immediately after preparation, it requires excessive amounts of exposure to light in order to obtain a sharp image and the plate often requires heating after exposure to accelerate the image-forming reaction.

The use of an aromatic diazide compound such as the sodium salt of 4,4′-diazidostilbene-2,2′-disulfonate has been suggested in conjunction with polyvinyl pyrrolidone. Such diazide-polyvinyl pyrrolidone coatings also require excess exposure to light. Diazide-polyvinyl pyrrolidone systems generally require about twice the exposure time under the same treatment conditions as do the conventional dichromate-gum arabic systems.

It has now been found that coating compositions containing a water-soluble diazide salt and a water-soluble hydroxyalkyl ether of cellulose are unexpectedly stable during storage in the substantial absence of light and form lithographic plates which are also extremely stable under storage conditions for long periods of time. In addition, the coated plates require significantly less exposure to light than do plates conventionally in use.

The water-soluble hydroxyalkyl ethers of cellulose are well known materials. They are described in U.S. Patent No. 1,941,278 to Schorger and their method of preparation is described at page 8 thereof. As noted in Example IV of the Schorger patent, they are made by reacting cellulose with an appropriate alkylene oxide. Alternatively, they can be prepared by reacting an alkali cellulose with an appropriate chlorohydrin.

The water soluble hydroxyalkyl ethers of cellulose that are particularly applicable to this invention are those in which the alkyl groups attached to the cellulose molecule through an ether oxygen atom contain from two to about five carbon atoms such as water soluble hydroxyethyl cellulose, hydroxypropyl cellulose, hydroxyisopropyl cellulose, hydroxy-n-butyl cellulose, hydroxyisobutyl cellulose, hydroxy-2,2-dimethylethyl cellulose and hydroxypentyl cellulose.

As is well known, the hydroxyalkyl ethers of cellulose can also have other substituents on the cellulose groups in addition to the hydroxyalkyl ether groups. Such additional substituents can also be present in the hydroxyalkyl ethers used in this invention. Representative substituents on the cellulose groups include alkyl groups, alkoxyalkyl groups, alkoxy groups, hydroxy groups and mixtures thereof. Of course, such substituents should not be present in sufficient number or chain length so as to increase the molecular weight of the cellulose beyond the desired level.

As the prior art is aware, the molecular weight of the cellulose ethers used in this invention can be varied within wide limits. Best results are obtained when the molecular weight of the cellulose ethers employed is not too high. A convenient method of determining the suitability of hydroxyalkyl ethers of cellulose for use in this invention is based upon their viscosity in aqueous solutions. Two percent by weight of the hydroxyalkyl cellulose is dissolved in water at 25° C. If the viscosity of the resulting solution is less than about 200 centipoises, the molecular weight of the particular hydroxyalkyl cellulose is satisfactory for use in the coating composition of the present invention. Where the viscosity of the 2% aqueous solution exceeds about 200 centipoises, it is generally found that the particular hydroxyalkyl cellulose polymer has too high a molecular weight for use in the coating compositions of this invention. There is no lower limit on the viscosity of the aqueous solution since any low molecular weight hydroxyalkyl cellulose is satisfactory.

The aromatic diazides, the water soluble salts of which are employed in the composition of this invention are also known compounds and can be characterized by the formula:

$$N_3—R—N_3$$

where R is an organic group containing at least one bivalent aromatic ring and preferably having from six to about thirty carbon atoms. Thus R can be, for example, arylene, alkyl arylene, alkylene arylene alkylene, arylene alkylene arylene and arylene alkenylene arylene. From the foregoing, it will be apparent that typical R groups can include phenylene, naphthylene, phenylene phenylene, 5-ethyl phenylene

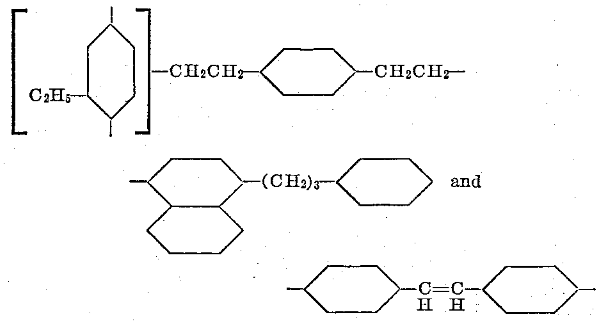

The R groups can also contain substituents that are inert to cellulose and do not accelerate the decomposition of the diazide, such as hydroxyl, nitrogen and oxygen. R preferably contains at least two aromatic rings.

It is preferable that the azide groups be para to each other if they are located on the same aromatic ring. Where two or more azide substituted aromatic rings are linked together directly or through a linking group, it is preferred that the azide groups be located para to the linking position. Preferably, the azide groups are not located ortho to the linking position because this results in greater tendency toward premature decomposition of the diazide.

Since for use in this invention, the aromatic diazide compound must be dissolved in an aqueous solution along with the hydroxylalkyl cellulose, the diazide is preferably present in the form of a soluble salt of an acid and an alkali or alkaline earth metal. Suitable acid groups include sulfuric acid, phosphoric acid and acetic acid. Suitable cations include sodium, potassium, lithium and calcium. The number of acid groups per diazide molecule is not critical but should be sufficient to impart solubility to the aromatic diazide compound without impeding the resonance thereof. From one to two acid groups per aromatic group is generally sufficient.

Typical axide compounds that can be employed in the form of their water soluble salts include:

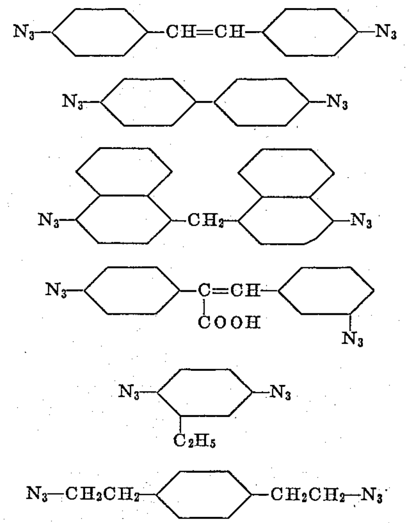

Particularly outstanding lithographic plates are obtained when the diazide salt employed is disodium-4,4′-diazidostilbene-2,2′-disulfonate and consequently this compound is preferred.

The diazide compounds and their salts are well known in the art and neither they nor their method of preparation are claimed as part of this invention. Further details on azide chemistry and on the preparation and characteristics of azide-containing compounds can be found in the following publications:

Rodd, "Chemistry of Carbon Compounds," vol. III*a*, pp. 309–312 (Elsevier, 1954)
Sidgwick, "The Organic Chemistry of Nitrogen," 1942 edition by Taylor et al. (Oxford, 1942)
Silberrad et al., J. Chem. Soc. (London), 89, p. 167 (1906)
Morgan, J. Chem. Soc. (London), 123, p. 228 (1923)
Nellting et al., Chemische Berichte, 26, p. 86 (1893)
Dutt et al., J. Chem. Soc. (London), 119, p. 2088 (1921)
Forster, J. Chem. Soc. (London), 107, p. 260 (1915)
Angeli, Atti Acc. ad. Lincei, 1927 [v], 5, p. 733
Chattaway et al., J. Chem. Soc. (London) 125, p. 1980 (1924)
Greiss, Annalen der Chimie, 137, p. 65 (1866)

In forming the stable lithographic plate coating compositions of this invention, the hydroxyalkyl cellulose and the aromatic diazide salt are both dissolved in an appropriate quantity of water, either individually to form separate solutions which are then blended or in the same aqueous solution. The quantity of water employed is determined by the viscosity and the solids content desired in the final solution, which, in turn, depends upon the method of application to be employed. The viscosity of the coating composition should range from about 5 to about 1000 centipoises at 25° C. and the composition should have a dissolved solids content from about 2 to about 50% by weight, preferably from 5 to 10% by weight. Generally, there should be at least one part by weight of hydroxyalkyl cellulose present in the coating composition for each part by weight of diazide compound employed and preferably there should be at least 5 parts. At ratios above about 20 parts by weight of hydroxyalkyl cellulose per part by weight of diazide compound, the speed of development of the lithographic plate coated by means of the composition becomes appreciably slower. For some applications, however, very high ratios of hydroxyalkyl cellulose to diazide compounds are desirable since such high ratios, although requiring substantially longer developing time, require only a minimum of exposure to light. The required exposure time at ratios of about 75 parts of hydroxyethyl cellulose to 1 part of diazide compound can be as low as under one minute. Good lithographic plates are usually not obtained, at ratios greater than about 100 to 1 of hydroxyalkyl cellulose to diazide compounds. Ratios of hydroxyalkyl cellulose to diazide compound less than about 1 to 1 are economically unfeasible since any advantage of using this invention is more than offset by the increased cost of the resulting lithographic plates. For use in making presensitized plates, the composition preferably does not contain more than 20 parts of hydroxyalkyl cellulose per part of diazide compound.

In many cases, better results are obtained if a surface active agent is added to the coating compositions of this invention. Any type of non-ionic surfactant known in the art can be employed. A typical example is "Triton X–100" a surface active agent manufactured by Rohm & Haas which is a polyethylene glycol p-octyl phenol ether. Other suitable non-ionic surfactants are described in "Surface Activity" by Moilliet et al. (2nd edition, Van Nostrand, 1961). Only a small amount of surfactant should be used, generally from about 0.5 to 5 parts per 100 parts by weight of hydroxyalkyl cellulose.

Where the coating compositions are to be stored for long periods of time, it is often desirable to add a small quantity of a fungicide to the composition to prevent decomposition of the cellulose through attack by microorganisms. Any conventional fungicides can be employed and the amount used should be as small as possible.

Direct sunlight or other sources of intense light should be avoided in storing the compositions of this invention. The compositions are preferably kept in an opaque container.

The base plates to which the coating compositions of this invention are applied are any plates conventionally used in lithography. Although metal plates such as plates made of zinc, aluminum, steel, copper or chromium are generally preferred, plastic plates can also be employed. In addition, very satisfactory results are obtained with several types of bi- and tri-metallic plates.

In one particular type of bi-metallic plate, a layer of a dissimilar metal is electroplated over a base metal. After application of the photosensitive coating and the subsequent application of developer, the deep-etching solution is used to etch the uncoated portion of the plate down to the base metal. When the plate is completed, therefore, the image and non-image areas of the plate are comprised of dissimilar metals. The particular deep-etching solution used exposes the particular base metal desired which is either hydrophylic or hydrophobic depending upon which is required. Most bi-metal plates of this type use copper for the image areas and chromium for the non-image areas since copper can easily be made ink receptive and chromium can easily be made water receptive. For example, a solution of nitric acid can be used to render either copper or nickel hydrophobic and at the same time render chromium, stainless steel or aluminum hydrophylic. The same result can be achieved with a 2 to 5% solution of sulfuric acid or a 10 to 25% solution of phosphoric acid. Thus, a satisfactory plate for use in this invention would involve any combination of copper or nickel for the image areas and chromium, stainless steel or aluminum for the non-image areas.

An alternate type of plate, referred to in the industry as the "IPI Trimetal" plate, consists of a zinc or steel metal plate on which copper is electroplated to a thickness of about 0.00001 to 0.001 inch. A very thin film of chromium, about 0.00005 to 0.00007 inch thick is electroplated over the copper. After the application of the photosensitive coating, exposure and development, the exposed surface of the plate is comprised of chromium metal. A special chromium etch is then used to dissolve the exposed chromium thereby exposing the copper underlayer.

Another type of plate consists of a sheet of aluminum which is electroplated with copper and then with chromium. This is processed in the same manner as the "IPI Trimetal" plate and is referred to as a "Lithure" plate.

A suitable bi-metal plate is an "Aller" plate which consists of a base of stainless steel electroplated with copper. Another type of plate is the "Lithengrave" plate consisting of a base of aluminum electroplated with copper.

In preparing a lithographic plate by means of this invention, the metal plates can be grained prior to application of the coating. Graining is merely a roughening of the surface of the metal to provide additional surface area. Conventional abrasives are employed in this operation such as silicon carbide, aluminum oxide, sand or crushed quartz. Conventional methods of graining can be employed in the present invention. For example, the plate may be wet with water containing a surface active agent and then an abrasive sprinkled over the plate and a motor driven brush then worked over it for a period of time. Alternatively, the various chemical treatments employed in the lithographic art for graining the metal can be employed.

The photosensitive coating composition is then spread on the base plate. The method of application of the coating depends to a large extent upon the viscosity of the coating composition. Where the composition has a relatively low viscosity, between about 1 and 75 centipoises, the coating composition may be sprayed on using conventional spray techniques. Where the viscosity of the composition is in the vicinity of about 1 to 200 centipoises, the coating can be wiped on with a brush or a coating cloth.

In the viscosity range of about 1 to 200 centipoises, the coating can be "whirled" on. Many "whirl on" techniques have been described in the literature. They essentially involve the application of the coating composition to the base plate with the base plate thereafter being revolved at a very high speed whereby the coating solution is spread uniformly about the plate.

More viscous compositions, i.e., compositions having a viscosity of up to about 1000 centipoises, can be spread on using a coating machine or the like or can be heated slightly to reduce the viscosity.

The amount of coating contained on the plate generally ranges from about 4 to 12 microns, preferably from about 6 to 8 microns. When the coating is thicker, the time required for developing the plate increases and more active developers are required to yield comparable results. For any given method of applying the coating, it is desirable to use as high a solids content in the coating composition as possible.

After the coating is applied to the plate, it is permitted to dry. The plate can be maintained at room temperature so as to permit evaporation of the water or it can be put in an air oven at a temperature of about 150° F. to accelerate the evaporation of water.

After the coating has been applied, the plate is ready for exposure to light to form an image. The coated plates prepared by means of this invention are extremely stable if stored in a dark place. Unlike many other types of coated plates, the coated plates of this invention do not undergo a "dark reaction" and accordingly, there is essentially no limit on the time they can be stored.

Whenever it is convenient, the plate is contacted with the image to be duplicated, according to conventional techniques, and thereafter exposed to light for the requisite period of time. The image is generally carried on a film base ranging in thickness from about .003 to about .007 inch. Alternatively, glass or paper may be used to transfer the image. The deep-etched plates require positives. Positives are made from negatives either as contact prints or by photographing the negative and using the reversed negative to transfer the image. Halftone positives or negatives are used during the exposure of the plate wherever necessary in accordance with conventional procedure. The sensitized plate is contacted with the photographic positive by any one of a number of methods. For example, a vacuum frame can be employed. This type of frame is similar to a conventional print frame except that vacuum is employed to insure tight contact between positive and plate. Various "step-and-repeat" machines have also been designed for this purpose. The exposure time necessary in any given operation will be dependent upon the sensitivity of the coating, the degree of reproduction of the positive required and the characteristics of the positive. Accordingly, a process of trial and error is generally used.

It has been found that plates prepared by means of this invention are at least as photosensitive as the best of the prior art plates and frequently require a substantially smaller exposure to light under comparable conditions. For example, under a given set of conditions, where a conventionally coated plate uses as the coating a bichromate-gum arabic coating and an exposure time of from 6 to 8 minutes is required, an identical plate produced by means of this invention would require an exposure time of only 2 to 3 minutes. Of course, where the plate has been overexposed to some slight extent, this can often be compensated for by overdeveloping and correspondingly where the plate has been slightly underexposed, underdeveloping will in many instances cure the deficiency.

The purpose of exposing the plate to light is to harden the photosensitive coating and thereby render it insoluble in the developing solution. The exact nature of the hardening process in this invention is not clearly understood but it undoubtedly involves some form of cross-linking of the hydroxyalkyl cellulose. Since a positive is used, light will pass through the non-image areas of the positive thereby hardening the non-image areas of the plate. On the other hand, since the image areas of the positive prevent light from reaching those portions of the plate in contact therewith, the image areas of the plate will be unhardened and will remain soluble in the developing solution.

The purpose of the developing operation is to cause the solution of those portions of the coating which were not hardened by exposure to light. Thus, at the conclusion of the developing operation, the plate will be coated only on the non-image portions of the plate. The image portions of the plate will be essentially uncoated.

Conventional developing solutions can be used with the photosensitive coating of this invention. One of the more common developing solutions in use today is a concentrated aqueous solution of calcium chloride also containing lactic acid. A conventional deep-etch developer will contain about 50 cc. of 85% lactic acid and 1000 cc. of an aqueous calcium chloride solution having a density of about 40° Baumé. Sufficient additional water is added to the developer to achieve the desired density for development in accordance with conventional procedure. Thus, at a developing temperature of between 70 and 75° F., the finished developer preferably has a density of about 37° Baumé, while at a temperature of 80 to 85° F., it preferably has a density of about 39° Baumé.

Another commercially available developer makes use of zinc chloride in addition to the calcium chloride and lactic acid. This is made from 350 grams of zinc chloride technical grade, 700 grams of commercial calcium chloride, 166 cc. of lactic acid and 1000 cc. of water. The salts should be dissolved in the water and the lactic acid then added. The density at 80° F. should be adjusted to about 41.5° Baumé. This developer is satisfactory for developing at temperatures of 68 to 90° F.

Other developing solutions can be used. The general characteristic of a developing solution is a solution in which the unhardened coating composition is substantially soluble while the hardened composition is substantially insoluble.

The developer is applied by spreading a liberal quantity thereof onto the plate and thereafter working it gently along the plate with a developing pad until the coating appears to be removed from the image area. The spent developer should be removed and a second application of developer made. The second application is left on the plate for a somewhat longer interval than was used for the first application. A third application of developer is sometimes employed. The careful observation of the course of development can be facilitated by the use of a dye which is added to the coating composition. An alternate method of gauging the degree of development uses the conventional Lithographic Technical Foundation Sensitivity Guide.

In the method of this invention, conventional developing solutions can be used directly. However, in view of the fact that the coating compositions of this invention are more rapidly insolubilized, it is desirable to adjust the speed of the developer if it is not desired to decrease the developing time.

In all of these instances, as in the prior art processes, the exact developing time and the minimum salt concentration of the developer are matters for trial and error for a particular plate. When once determined, all plates using this process will use approximately the same salt concentration in the developer. The exact developing time for any individual plate may be adjusted to correct for the variables inherent in plate manufacture.

At the conclusion of the developing operation and the removal of the developer from the plate, the next step is the "deep-etching" step. The deep-etching solution is spread over the plate and allowed to react for about one minute. The purpose of the deep-etching solution is to dissolve enough of the metal in the image areas to slightly depress these areas. The non-image areas of the plate are coated with the photo-hardened coating and hence will not react with the etching solution. The actual depth of etching is only about 10 to 20 microns.

The conventional deep-etching solutions can be employed. For zinc plates, such a solution generally contains a high concentration of calcium chloride and an appreciable amount of ferric chloride and hydrochloric acid. The solvent is water. In some instances, the ferric chloride is omitted. The calcium chloride provides the necessary stabilization of the light hardened stencil which covers all of the non-image areas of the plate. The hydrochloric acid serves to etch the image areas by reacting with the zinc to form zinc chloride and hydrogen. The ferric chloride also reacts with zinc to form zinc chloride and ferrous chloride or elemental iron. The rate of etching increases as the temperature increases. At 65° F., about 1.5 minutes is generally sufficient etching time; at 75° F., 1 minute; at 85° F., 45 seconds while 30 seconds generally suffices at 95° F. If the etching action proceeds too long, the image areas will be so deep that they will not print properly on the press.

Many different deep-etching solutions can be employed. For example, a suitable deep-etching solution for zinc plates can include 1000 cc. of a calcium chloride solution having a density of 40 to 41° Baumé, 25 grams of solid iron perchloride and 20 cc. of concentrated HCl. The finished deep-etching solution of this type should be at a density of 40 to 41° Baumé at 77° F. An alternate deep-etching solution for zinc plates uses in addition to the above, 22 grams of powdered cupric chloride.

A suitable deep-etching solution for aluminum plates uses 1000 cc. of calcium chloride solution having a density of 40 to 41° Baumé, 380 grams of technical grade zinc chloride, 285 cc. of an iron perchloride solution having a density of 50 to 51° Baumé, 14 cc. of concentrated hydrochloride acid and 27 grams of powdered cupric chloride.

The deep-etching solution of the appropriate type is poured liberally onto the plate and spread evenly and after sufficient contact time, the etching solution should be sponged off.

In the case of a poly-metallic plate containing a chromium surface coating, the deep-etching solution used should be sufficient to remove the chromium in the exposed portions of the plate. Such a chromium etch conventionally contains a high concentration of a salt such as calcium chloride to stabilize the light hardened deep-etch stencil. In addition, the chromium etch must contain a material which will attack and dissolve the chromium. Typically, it will contain hydrochloric acid in sufficient concentration to dissolve the chromium without effecting the copper layer underneath.

In the case of a copper surfaced plate, such as the Lithengrave plate, the etching solution is typically a 46.5° to 47° Baumé solution of ferric nitrate which oxidizes the exposed copper surface to cupric nitrate, the reaction stopping when all of the copper is removed from the non-image areas. In the case of the Aller plate, the etching solution will generally contain hydrochloric acid, calcium chloride and ferric chloride.

The next step, conventionally, is an alcohol wash which is used to rinse off any residual developing solution and to prevent further etching. Ordinarly ethyl alcohol or commercial denatured alcohol is quite satisfactory for this purpose but any alcohol in which the coating composition is insoluble can be employed including ethyl alcohol, methyl alcohol, isopropyl alcohol, butyl alcohol, ethyl Cellosolve and methyl Cellosolve. Preferably the alcohol should be anhydrous so as to prevent water contamination of those parts of the plate destined to become oleophylic. It is sufficient if the alcohol is simply wiped onto the plate and sponged across it several times. The plate should be dried as for example by fanning after the last application of alcohol.

When desired, after the plate has been developed and etched, the image area of the plate may be copperized in accordance with various procedures known to the art as, for example, the procedure outlined in U.S. Patent No. 2,676,886.

At the conclusion of the alcohol washing step, a coating of lacquer is generally wiped onto the plate. The applicable lacquers are well known in the art and consist of organic resins dissolved in organic solvents. A good deep-etch lacquer must be oleophylic and have a good resistance to abrasion. In addition, it should have the ability to adhere tightly to the clean, dry metal surface.

The lacquer is spread over the plate in a thin layer and allowed to dry. The drying process involves the evaporation of the organic solvent leaving behind a continuous coating of the organic resin.

In some instances, as in the prior art, where the exposed metal surface is sufficiently hydrophobic, a lacquer coating is unnecessary and may be dispensed with.

In the image areas of the plate, the lacquer will have adhered directly to the metal surface. In the non-image areas of the plate, since these portions were coated with the hardened coating composition, the lacquer will form a layer over the coating. A coating of a greasy lithographic ink is then applied and spread over the lacquer coating. The purpose of the ink is to increase the hydrophobic nature of the lacquer layer and to make the image visible. The types of ink useful in lithographic applications are well known in the art and form no part of this invention. Further details on inks useful in lithography can be obtained from Chapter XV of "Printing and Litho Inks" by H. J. Wolfe (4th edition, 1949, MacNair-Dorland Co.).

A deep-etch developing ink should be non-hardening so that a plate with the ink on it can be stored for two or three weeks with the ink remaining soluble in a conventional solvent. In addition, the ink must not soften or smear when the plate is immersed in water at a temperature of about 125° F.

After the deep-etch plate has been covered with lacquer and then developing ink, it can be placed in a trough filled with water at about 125° F. After a few minutes, the water penetrates through the developing ink and the lacquer in the non-image areas and begins to swell the photo-hardened coating. As soon as the photo-hardened coating has absorbed enough water, it will not hold the lacquer and developing ink and they can be removed with absorbent cotton. Further swelling of the coating makes it possible to remove it by scrubbing the plate with a scrub brush. On the image areas, however, the lacquer adheres to the metal and the lithographic ink adheres to the lacquer. When no lacquer is employed, the ink adheres to the metal on the image areas.

Thus, on the plate, after this water treatment, the image areas are covered with ink and are thus oleophylic and hydrophobic. The remaining non-image areas of the plate are either comprised of bare metal or are coated with a microscopic residual layer of photo-hardened coating material. In either event, the non-image areas of the plate are hydrophylic and oleophobic.

The plates can then be used immediately in the conventional lithographic press. If desired, a gum arabic protective coating can be spread on the finished plate in accordance with conventional procedures.

The following examples are presented as illustrative of modes of carrying out the present invention.

*Example I*

Two solutions, identified as A and B, were prepared. Solution A was comprised of 1000 parts by weight of water, 100 parts by weight of hydroxyethyl cellulose, having a viscosity in a 2% aqueous solution at 25° C. of 7 centipoises, 0.1 part of "Dowicide B," a fungicide manufactured by Dow Chemical Company, and 2.5 parts of "Triton X–100," a polyethylene glycol p-octyl phenol ether surface active agent sold by Rohm & Haas.

Solution B was made by dissolving 25 parts by weight of di-sodium-2,2'-diazidostilbene-4,4'-disulfonate in 500 parts by weight of water.

Five hundred parts of solution A were mixed with 200 parts of solution B to form a coating compositiong in accordance with this invention, having a hydroxyethyl cellulose to diazide ratio of 5 to 1 by weight and a total solids content of about 9%. The composition was stored in a dark container and at the end of six months, showed no signs of any deterioration or chemical decomposition.

*Example II*

A standard pregrained aluminum lithographic plate was counter-etched for one minute with a dilute solution of acetic acid made by mixing 6 ounces of glacial acetic acid dissolved in 1 gallon of water. The plate was then rinsed under running water to remove the acid and any reaction products formed. A coating composition prepared in accordance with Example I was then applied to the plate by the "whirl on" technique using a whirler speed of about 50 r.p.m. After application of the coating, the plate was allowed to stand in a dark place for several hours until all of the water in the coating composition had evaporated leaving a film of about 5 microns thick. The coated plate was exposed to a 35 ampere arc light at a distance of 36 inches through a positive in a standard vacuum frame for three minutes. A developing solution was then wiped on the plate and maintained there until metal was exposed on the image areas of the plate. Two additional applications of developer were then made and removed. The initial developing time was 1½ minutes.

The developing solution employed was made from 24.5 parts by weight of water, 19 parts of calcium chloride, 8.7 parts of zinc chloride and 6.9 parts of lactic acid and adjusted with sufficient water to achieve a density of 39° Baumé.

A deep-etching solution containing 1000 cc. of calcium chloride solution having a density of 40 to 41° Baumé, 380 grams of technical grade zinc chloride, 285 cc. of an iron perchloride solution having a density of 50 to 51° Baumé, 14 cc. of concentrated hydrochloric acid and 27 grams of powdered cupric chloride was then applied liberally to the plate, allowed to remain for 1 minute and then sponged off. The plate was then flushed with commercial denatured alcohol for 10 seconds to remove any residual developer or etching solution and then wiped dry.

After the plate was dried, a lacquer coating was wiped onto the plate to form a smooth, continuous coating and was then allowed to dry. The lacquer employed had the following composition:

| Component: | Parts by weight |
|---|---|
| Xylene | 4.0 |
| Cyclohexanone | 12.0 |
| Isophorone | 5.0 |
| Vinylite VYHH (a copolymer of vinyl chloride and vinyl acetate containing about 87% vinyl chloride) | 3.5 |
| Victoria Blue dye | 0.06 |

A coating of a greasy lithographic ink was then applied over the dried lacquer coating. The ink had the following composition and was prepared by grinding in a conventional ink mill:

| Component: | Parts by weight |
|---|---|
| Regular #3 varnish | 40.0 |
| Carbon black | 28.0 |
| Gilsonite | 10.0 |
| Turpentine | 50.0 |
| Mineral spirts | 50.0 |

The ink-coated plate was immersed in a trough filled with water at a temperature of 125° F. and allowed to soak for several minutes. The plate was sponged with absorbent cotton to remove the lacquer and ink adhering to the non-image portions of the plate. Thereafter the plate was scrubbed with a scrub brush to remove the hardened photosensitive coating from the plate thereby exposing bare aluminium on the non-image portions of the plate and leaving an ink coating on the image portions of the plate. A conventional aqueous gum arabic solution was applied to the plate and wiped to dryness to form a protective coating, after which the plate was used for printing on a conventional lithographic press yielding copies of very clear quality. In addition, whenever the plate was deliberately flooded with ink, it took only three or four copies to clear the non-image areas and obtain clear copies. The plate was used to make 10,000 copies and was found to be satisfactory for continued use at the end of the press run.

*Example III*

A presensitized plate was prepared by applying the coating composition of Example I to a standard pre-grained aluminum plate to achieve a coating on the plate of a thickness of six microns. The plate was then stored in a dark place for six months and then exposed to light and treated in accordance with the procedure of Example II. The printed copies obtained from this plate were in every way as good as those obtained from the plate described in Example II thus proving that neither the coating compositions nor the presensitized plates of this invention undergo any significant dark reaction.

*Example IV*

The procedure of Example II was repeated using as the base plate a standard zinc plate which had first been treated with a 10% solution of sodium ferrocyanide for 3 minutes and then washed in warm water. The deep-etching solution used in this example had the following formulation, all other conditions being the same:

| Component: | Parts by weight |
|---|---|
| Water | 480 |
| Calcium chloride | 510 |
| Zinc chloride | 275.5 |
| Hydrochloric acid | 30 |

Equivalent results were obtained.

*Example V*

The procedure of Example II was repeated using as the base plate a "Lithengrave" plate consisting of copperized aluminum and using a negative in place of a positive. During the deep-etching step, the exposed copper was dissolved leaving an exposed layer of aluminum in the non-image areas of the plate. All conditions of Example II were employed except that the deep-etching solution was an aqueous solution of ferric nitrate having a density of 46.5° to 47° Baumé.

Results equivalent to Example II were obtained.

*Example VI*

The procedure of Example II was repeated using as the base plate a "Lithure" plate consisting of a sheet of aluminum electroplated with copper and then with chromium. The deep-etching solution employed was made by mixing 921 grams of water, 1006.25 grams of calcium chloride and 924 grams of zinc chloride, adjusting the density to 58.3° Baumé and filtering. To 2808.8 grams of filtrate were added 181 grams of muriatic acid.

Results equivalent to Example II were achieved.

*Examples VII to IX*

The procedure of Example III was repeated using the following coating compositions. Equivalent results were obtained in each case.

| Examples | Parts by Weight | | |
|---|---|---|---|
| | VII | VIII | IX |
| Hydroxyethyl cellulose | 100 | 100 | 100 |
| Disodium 2,2'-diazidostilbene-4,4'-disulfonate | 60 | 30 | 70 |
| Water | 1,000 | 700 | 1,200 |
| Triton X-100 | 2.5 | 2.5 | 2.5 |
| Dowicide B | 0.1 | 0.1 | 0.1 |

*Example X*

The procedure of Example II was repeated using a higher molecular weight hydroxyethyl cellulose having a viscosity in 2% aqueous solution at 20° C. for 28 centipoises. Equivalent results were obtained. Equivalent results were also obtained with a hydroxyethyl cellulose having a viscosity in 2% aqueous solution of 98.

It will be apparent from the foregoing that changes can be made herein without departing from the essential spirit and scope of the invention.

Having thus described the invention, that which is desired to be protected by Letters Patent is as follows:

1. A coating composition for use in the formation of photosensitive coatings on lithographic plates adapted for deep-etching comprising an aqueous solution of a water-soluble hydroxyalkyl ether of cellulose in which the alkyl groups contain from two to five carbon atoms, and a water-soluble salt of an aromatic diazide, said hydroxyalkyl ether of cellulose exhibiting in 2% aqueous solution at 25° C. a viscosity of less than 200 centipoises.

2. A coating composition as in claim 1 also containing a surface active agent.

3. A coating composition as in claim 1 wherein the hydroxyalkyl ether of cellulose is hydroxyethyl cellulose.

4. A coating composition as in claim 3 also containing a surface active agent.

5. A coating composition as in claim 3 wherein the aromatic diazide compound contains at least two aromatic rings per molecule.

6. A coating composition as in claim 5 wherein each aromatic ring contains at least one azide group.

7. A coating composition as in claim 3 wherein the diazide salt is a water-soluble salt of 4,4′-diazidostilbene.

8. A coating composition as in claim 7 wherein the diazide salt is disodium 4,4′-diazidostilbene-2,2′-disulfonate.

9. A photosensitive lithographic plate adapted for deep-etching capable of being stored for long periods of time without the occurrence of any significant dark reaction comprising a base plate having a coating comprised of a water-soluble hydroxyalkyl ether of cellulose and a water-soluble salt of an aromatic diazide compound, said hydroxyalkyl ether of cellulose exhibiting in 2% aqueous solution at 25° C. a viscosity of less than 200 centipoises.

10. A photosensitive plate as in claim 9 wherein the hydroxyalkyl ether of cellulose is hydroxyethyl cellulose.

11. A photosensitive plate as in claim 10 wherein the aromatic diazide compound contains at least two aromatic rings in the molecule.

12. A photosensitive plate as in claim 11 wherein each aromatic ring contains at least one azide group.

13. A photosensitive plate as in claim 10 wherein the diazide salt is a water-soluble salt of 4,4′-diazidostilbene.

14. A photosensitive plate as in claim 13 wherein the diazide salt is disodium 4,4′-diazidostilbene-2,2′-disulfonate.

15. A photosensitive plate as in claim 10 wherein the base plate is comprised of a metal selected from the group consisting of aluminum, copper, steel, zinc and chromium.

16. A photosensitive plate as in claim 10 wherein the base plate is comprised of at least two dissimilar metals.

17. In the method of preparing a deep-etched lithographic plate which comprises applying a photosensitive coating composition to a base plate, hardening at least a portion of said coating by exposing selected areas of the coating to light, dissolving the unhardened portions of the coating, deep-etching the uncoated portions of the base plate, applying a lithographic ink and removing the remaining portions of the coating from the base plate whereby the image areas of the lithographic plate are rendered olephylic and the non-image areas are rendered hydrophylic, the improvement which comprises using as the photosensitive coating composition an aqueous solution of a water-soluble hydroxyalkyl ether of cellulose in which the alkyl groups contain from two to five carbon atoms, and a water-soluble salt of an aromatic diazide, said hydroxyalkyl ether of cellulose exhibiting in 2% aqueous solution at 25° C. a viscosity of less than 200 centipoises.

18. A method as in claim 17 wherein the coating composition also contains a surface active agent.

19. A method as in claim 18 wherein the hydroxyalkyl ether of cellulose is hydroxyethyl cellulose.

20. A method as in claim 19 wherein the aromatic diazide compound contains at least two aromatic rings per molecule.

21. A method as in claim 20 wherein the diazide salt is a water-soluble salt of 4,4′-diazidostilbene.

22. A method as in claim 20 wherein the diazide salt is disodium-4,4′-diazidostilbene-2,2′-disulfonate.

References Cited by the Examiner

UNITED STATES PATENTS

| | | | |
|---|---|---|---|
| 2,584,317 | 2/1952 | Aller | 96—33 X |
| 2,687,958 | 8/1954 | Neugebauer | 96—33 X |
| 2,692,826 | 10/1954 | Neugebauer et al. | 96—91 |
| 2,848,328 | 8/1958 | Hepher | 96—91 |
| 3,118,765 | 1/1964 | Leonard et al. | 96—33 |

FOREIGN PATENTS

| | | |
|---|---|---|
| 886,716 | 10/1943 | France. |
| 838,699 | 5/1952 | Germany. |

OTHER REFERENCES

Mertle, National Lithographer, Vol. 67, November 1960, page 56.

NORMAN G. TORCHIN, *Primary Examiner.*

R. L. STONE, A. D. RICCI, *Assistant Examiners.*